United States Patent [19]

Hirota

[11] Patent Number: 4,856,033
[45] Date of Patent: Aug. 8, 1989

[54] SOLID STATE IMAGER DEVICE WITH EXPOSURE CONTROL WITH NOISE REDUCTION

[75] Inventor: Isao Hirota, Kanagawa, Japan
[73] Assignee: Sony Corporation, Tokyo, Japan
[21] Appl. No.: 163,865
[22] Filed: Mar. 3, 1988

[30] Foreign Application Priority Data

Mar. 6, 1987 [JP] Japan .................. 62-51337
Apr. 14, 1987 [JP] Japan .................. 62-91418

[51] Int. Cl.$^4$ .................. G11C 19/28; H01L 29/78; H04N 3/14; H03K 3/42
[52] U.S. Cl. .................. 377/58; 377/61; 357/24; 358/213.19; 307/311
[58] Field of Search .................. 357/24, 30; 377/57–63; 358/213.19, 213.25, 213.26

[56] References Cited

U.S. PATENT DOCUMENTS

| | | | |
|---|---|---|---|
| 3,931,463 | 1/1976 | Levine | 357/24 LR |
| 4,245,164 | 1/1981 | Funahashi | 307/311 |
| 4,322,753 | 3/1982 | Ishihara | 357/24 LR |
| 4,651,215 | 3/1987 | Bell et al. | 358/213.25 |
| 4,783,702 | 11/1988 | Sone et al. | 358/213.19 |
| 4,800,435 | 1/1989 | Ikeda et al. | 358/213.19 |

Primary Examiner—Gene M. Munson
Attorney, Agent, or Firm—Hill, Van Santen, Steadman & Simpson

[57] ABSTRACT

A solid state imager has a substrate with a plurality of light receiving areas, with vertical registers to transfer charges accumulated in the light receiving areas either through the vertical registers to a horizontal register section and an output terminal, or to a drain region. The transfer is accomplished by use of externally supplied driving pulses. By use of a high-speed normal-transfer operation, charges which are trapped by potential barriers and/or potential dips, and which would normally appear as noise in the form of black spots or bright spots, can be eliminated prior to the read out if the charge signals via the vertical registers and the horizontal register, whereby the output signal is produced free of such noise.

3 Claims, 13 Drawing Sheets

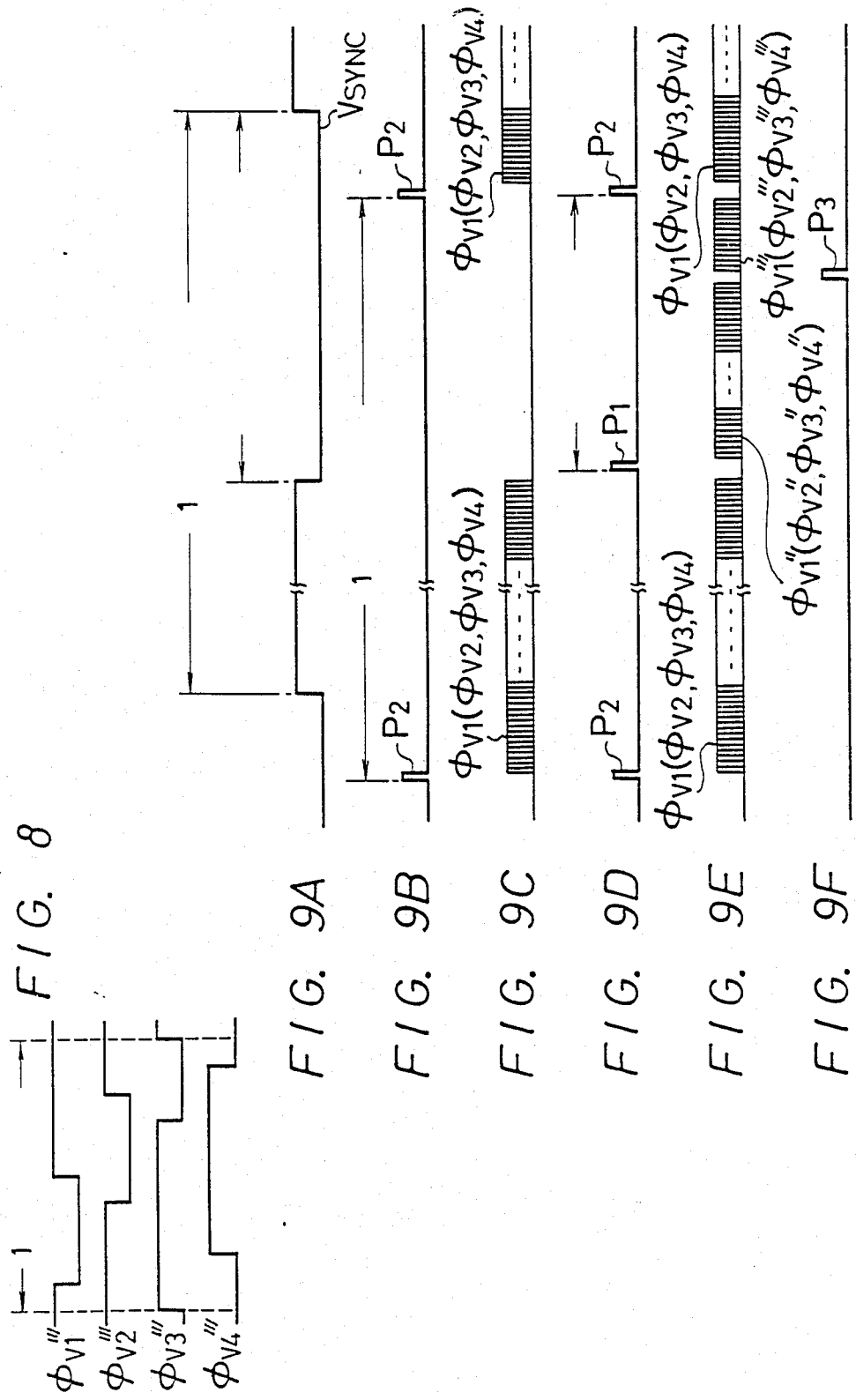

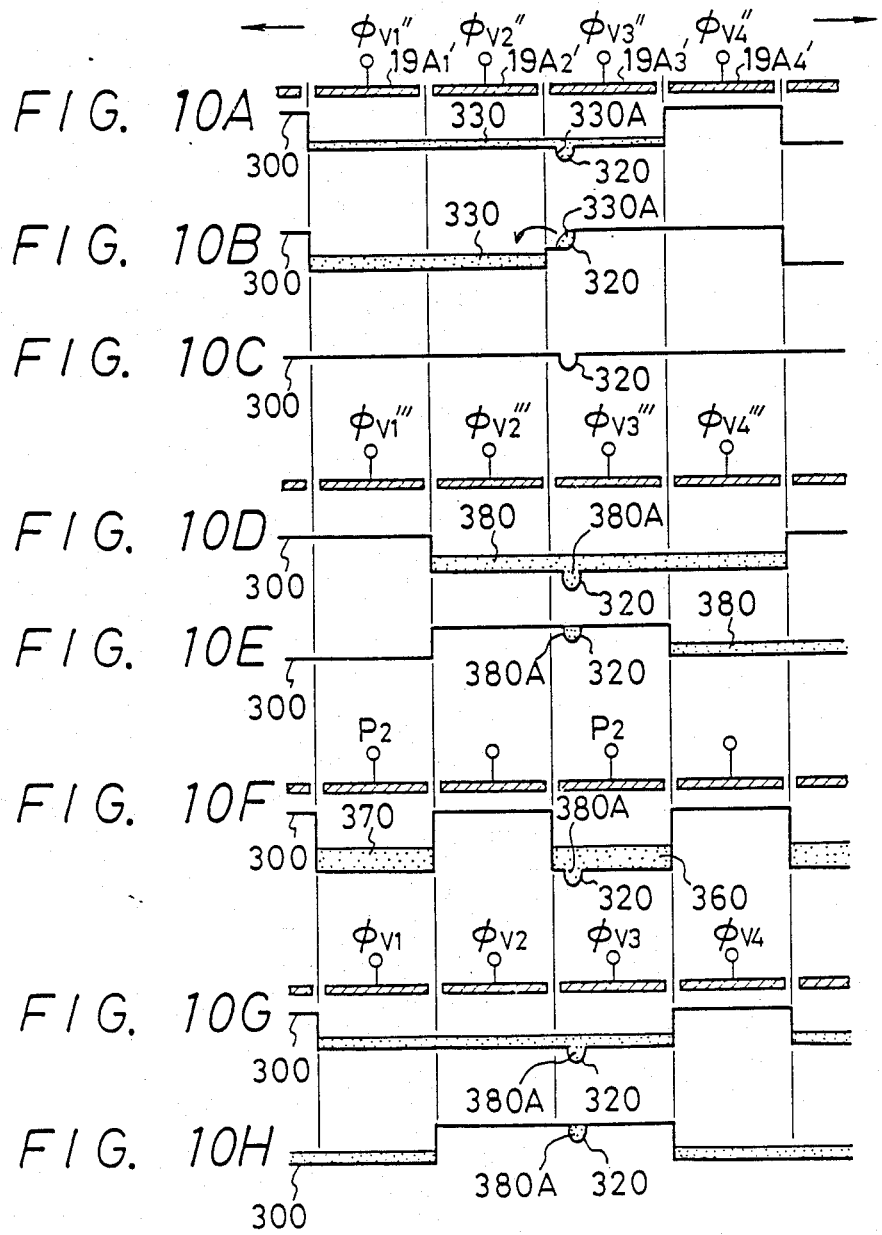

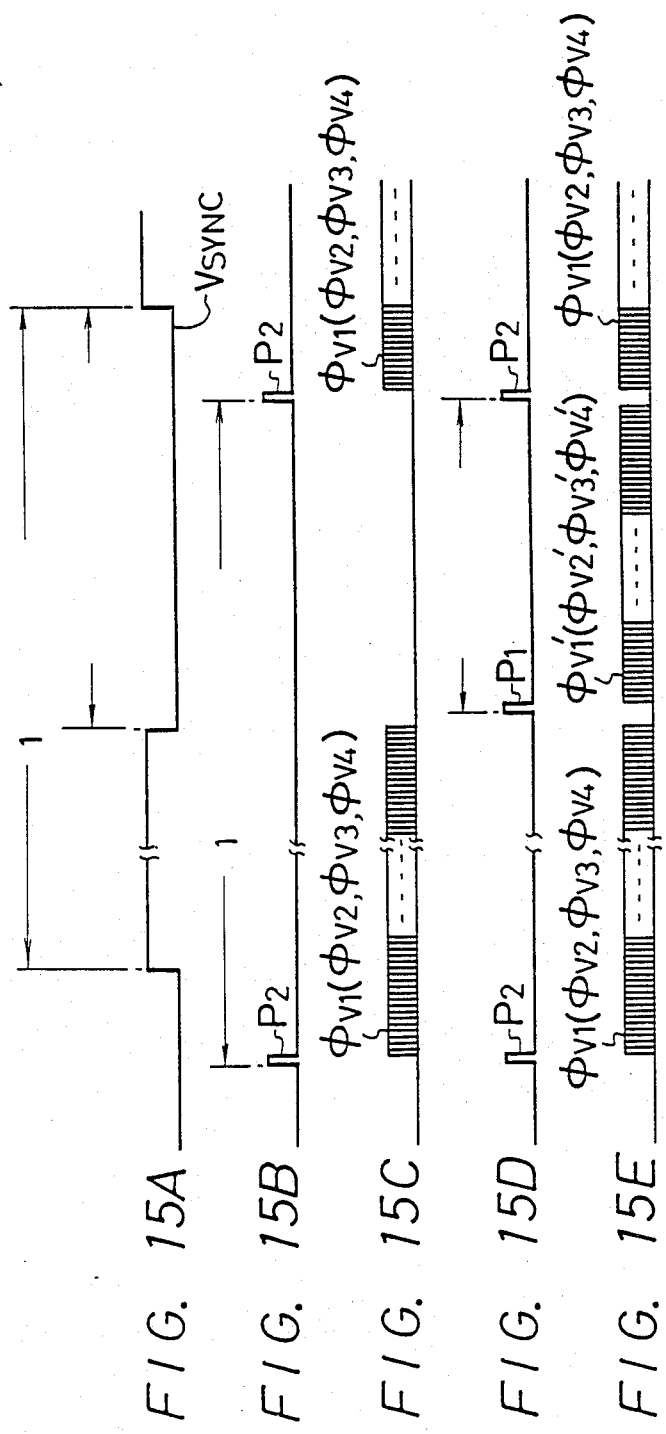

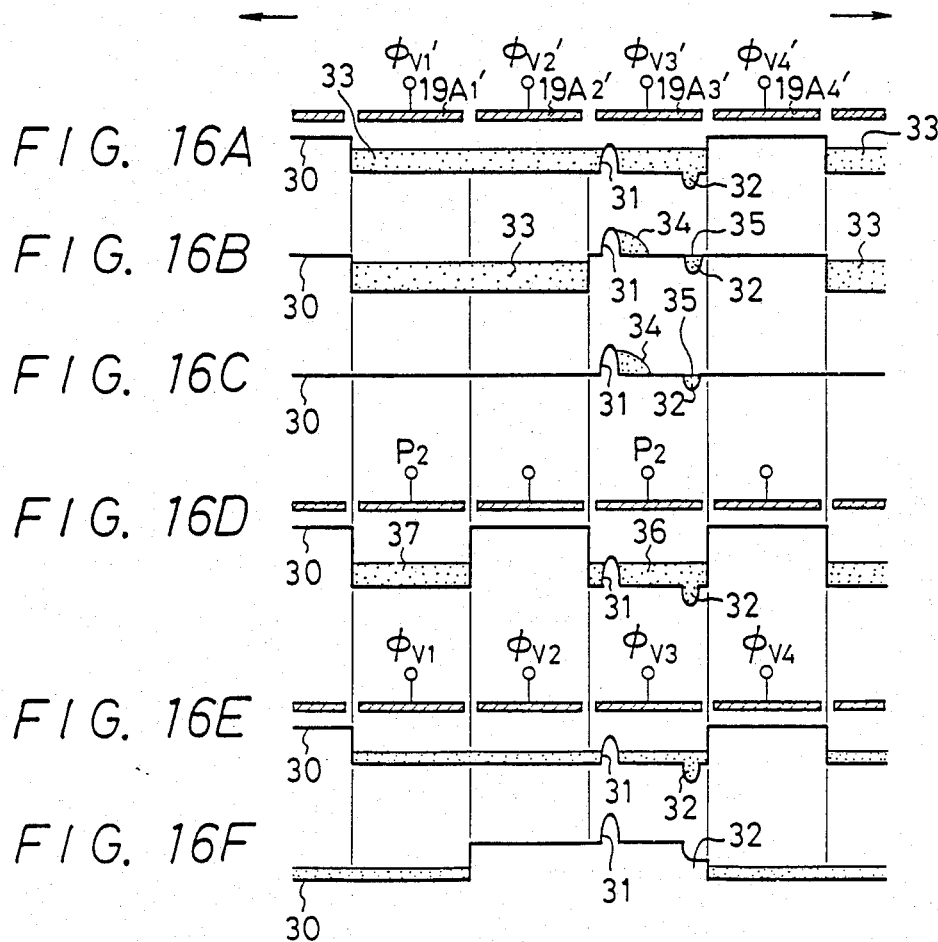

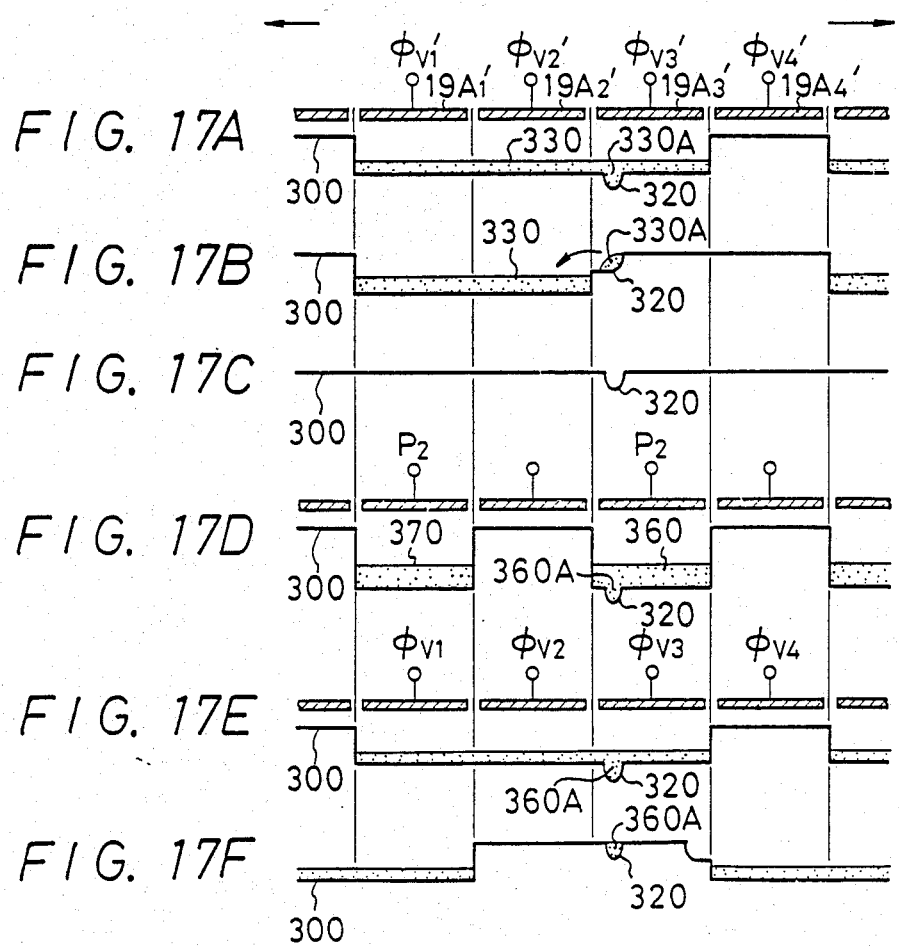

SOLID STATE IMAGER DEVICE WITH EXPOSURE CONTROL WITH NOISE REDUCTION

BACKGROUND OF THE INVENTION

1. Field of the Invention

This invention relates to a solid state imager device to which an interline transfer system is applied and which is provided with an electronic shutter mechanism.

2. Description of the Prior Art

There has conventionally been proposed an interline transfer type solid state imager device provided with an electronic shutter mechanism, the arrangement of which is schematically shown in FIG. 12.

This solid state imager device has a normal mode and an electronic shutter mode for selecting an exposure time, in a manner that the exposure time thereof can be set to one field period as well as to a predetermined time during one vertical blanking period, and comprises a solid state imager element section 1 and a timing generator 3 which is operated by a predetermined synchronizing signal supplied thereto from a synchronizing signal generating circuit 2.

The solid state imager device section 1 will first be explained in detail. On one major surface of a P-type silicon substrate 4, light recieving areas 5 each made of a photodiode are arranged in a matrix form. Vertical register sections 6 are arranged, through read-out gate areas 7, adjacent to the light receiving areas 5, to transfer charges accumulated in the light receiving areas 5 of each column of the light receiving areas 5 in the vertical direction (upward or downward direction in the sheet of FIG. 12). A horizontal register section 8 is provided on one end side of the respective register sections 6 to transfer the charges transferred downward in the sheet of FIG. 12 through the vertical register sections 6 in the horizontal direction at each horizontal line. A charge detecting section 9 are arranged at the output side of the horizontal register section 8 to detect the charges transferred through the horizontal register section 8. Thus, signals representative of images delivered from the charge detecting section 9 is derived at an output terminal 10. On the other end side of the respective vertical register sections 6, a drain region 12 is provided through discharge gate areas 11 to discharge the charges transferred upward in the sheet of FIG. 12 through the vertical register sections 6 as unnecessary charges.

As shown in FIG. 13, each of the light receiving areas 5 is constituted by a charge accumulating region 13 made of N-type region formed on the main surface of the P-type silicon substrate 4 and a insulating layer 14 made of an $SiO_2$ layer deposited on the charge accumulating region 13. In FIG. 13, areas 15, 16 and 17 are an overflow control gate region made of P-type region, an overflow drain region made of $N^+$-type region, and a channel stop region made of $P^+$-type region, respectively. These areas are not illustrated in FIG. 12.

Each of the vertical register sections 6 as show in FIGS. 13 and 14, is formed of a charge transfer region 18 made of N-type region arranged on the main surface of the P-type silicon substrate 4 at the vicinity of the charge accumulating region 13 and transfer electrodes $19A_1$, $19A_2$, $19A_3$, $19A_4$, $19A_1$, ... $19A_4$, each made of polycrystalline silicon deposited below the insulating layer 14 above the charge transfer region 18. The transfer electrodes $19A_1$, $19A_2$, $19A_3$ and $19A_4$ ... are selectively supplied with four-phase phase driving pulses $\phi v1$, $\phi v2$, $\phi v3$ and $\phi v4$ for a normal-speed normal-transfer operation in which the charges are transferred toward the horizontal register section 8 at a normal speed and four-phase driving pulses $\phi v1'$, $\phi v2'$, $\phi v3'$ and $\phi v4'$ for a high-speed inverse-transfer operation in which the charges are transferred toward the drain region 12 at a high speed. Further, a $P^+$-type region 20 is provided beneath the charge transfer region 18 for preventing smear.

Each of the read-out gate areas 7 arranged between each light receiving area 5 and the vertical register section 6 is formed of a read-out gate region 21 arranged between the charge accumulating region 13 and the charge transfer region 18 and a read-out gate electrode 22 deposited over the read-out gate region 21 through the insulating layer 14, as shown in FIG. 13. The read-out gate electrode 22 is formed by extending end portions of the transfer electrodes $19A_1$ and $19A_3$ of the vertical register section over the read-out gate region 21. The read-out gate electrode 22 is selectively supplied with a pulse $P_1$ for reading out unnecessary charges and a pulse $P_2$ for reading out signal charges, so that the charges accumulated in the charge accumulating region 13 of the light receiving area 5 can be read out to the charge transfer region 18 of the vertical register section 6.

The horizontal register section 8, a part of which is shown in FIG. 14, is formed of a charge transfer region 23 made of an N-type region arranged adjacent to the charge transfer region 18 of the vertical register section 6 and transfer electrodes 24 made of polycrystalline silicon deposited through the insulating layer 14 over the charge transfer region 23. The transfer electrodes 24 are provided so as to operate the horizontal register section 8 with two-phase driving pulses $\phi_{H1}$ and $\phi_{H2}$. A region 40 in FIG. 14 is a channel stop region.

The charge detecting section 9, although its detail is not illustrated, is formed of, for example, a floating diffusion amplifier.

Each of the discharge gate areas 11 is formed of a discharge gate region 25 made of an $N^-$-type region arranged adjacent to the charge transfer region 18 of the vertical register section 6 and a discharge gate electrode 26 made of polycrystalline silicon deposited over the discharge gate region 25 through the insulating layer 14, as shown in FIG. 14. The discharge gate electrode 26 is grounded in this case.

The drain region 12 is formed of an $N^{++}$-type region 27, obtained by diffusing an N-type impurity with a high concentration into the substrate 4 adjacent to the discharge gate region 25.

The timing generator 3 is so constructed as to generate the pulse $P_1$ for reading out unnecessary charges and the pulse $P_2$ for reading out signal charges, which are supplied to the read-out gate areas 7, the four-phase driving pulses $\phi v1$, $\phi v2$, $\phi v3$ and $\phi v4$ of 15.77 kHz (fsc/227, where fsc=3.58 MHz) for the normal-speed normal-transfer operation and the four-phase driving pulses $\phi v1'$, $\phi v2'$, $\phi v3'$ and $\phi v4'$ of 557 kHz (fsc/6) for the high-speed inverse-transfer operation, which are supplied to the vertical register sections 6, and the two-phase driving pulses $\phi_{H1}$ and $\phi_{H2}$ of 9.5 MHz which are supplied to the horizontal register section 8.

Reference is next made to the operation of the conventional solid state imager device constructed as described above.

Let it first be assumed that the normal mode is selected as the exposure time mode, wherein the exposure time period is set to one field period. As shown in FIG. 15B, the signal charge read-out pulse $P_2$ is supplied to the read-out gates 7 at a predetermined time point during the vertical blanking period at every field, whereby the charges accumulated in the light receiving areas 5 during one field period of exposure are read out to the vertical register sections 6, as signal charges. Then, as shown in FIG. 15C, subsequent to the supply of the signal charge read-out pulse $P_2$ to the read-out gate areas 7, the four-phase driving pulses $\phi v1$, $\phi v2$, $\phi v3$ and $\phi v4$ of 15.77 kHz for the normal-speed and normal-transfer operation are supplied through terminals $28A_1$, $28A_2$, $28A_3$ and $28A_4$ (FIG. 12) to the vertical register sections 6 to thereby transfer the read out signal charges to the horizontal register section 8. The horizontal register section 8 is being supplied with the two-phase driving pulses $\phi_{H1}$ and $\phi_{H2}$ of 9.5 MHz respectively through terminals $19A_1$ and $29A_2$. Thus, the charges read out as the signal charges are transferred to the charge detecting section 9 at every horizontal line, and consequently the image signals based on the signal charges are delivered to the outupt terminal 10. FIG. 15A shows the waveform of a vertical synchronizing signal $V_{SYNC}$.

Next, it is assumed that the electronic shutter mode is selected as the exposure time mode, wherein the exposure time period is set to a desired time period within the vertical blanking period. As shown in FIG. 15D, at the beginning of the vertical blanking period, the unnecessary charge read-out pulse $P_1$ is supplied to the read-out gate areas 7, whereby the charges accumulated in the light receiving areas 5 up to the vertical blanking period are read out to the vertical register sections 6 as unnecessary charges. Next, as shown in FIG. 15E, the four-phase driving pulses $\phi v1'$, $\phi v2'$, $\phi v3'$ and $\phi v4'$ of 557 kHz for the high-speed inverse-transfer operation are supplied to the vertical register sections 6 to thereby discharge the charges read out as unnecessary charges to the drain region 12 in the course of eight horizontal periods. Next, as shown in FIG. 15D, after the desired time in the vertical blanking period has elapsed, the signal charge read-out pulse $P_2$ is supplied to the read-out gate areas 7, in the same manner as shown in FIG. 15B to thereby read out the charges accumulated in the light receiving areas 5 after the unnecessary charge read-out pulse $P_1$ is supplied to the read-out gate area 7 to the vertical register sections 6. Then, as shown in FIG. 15E, the four-phase driving pulses $\phi v1$, $\phi v2$, $\phi v3$ and $\phi v4$ of 15.77 kHz for the normal-speed normal-transfer operation are supplied to the vertical register sections 6, whereby the charges read out as signal charges are transferred to the horizontal register section 8. Thus, in the electronic shutter mode, the signal charges are accumulated in the light receiving areas 5 during the desired time period in the vertical blanking period, that is, from the time the unnecessary charge read-out pulse $P_1$ is supplied to the read-out gate areas 7 to the time the signal charge read-out pulse $P_2$ is supplied to the same, for example, for 1/1800 second, and an image signal based on those signal charges is delivered to the output terminal 10.

As described above, the solid state imager device provided with the electronic shutter mechanism does not require a mechanical shutter mechanism but can pick up an image which may rapidly move without any residual image or blurs. Therefore, when a video camera is equipped with such an imager device, the video camera can be made smaller.

However, when the above mentioned solid state imager device provided with the electronic shutter mechanism is used, a defect in image, specifically luminous or black points not related to the pick-up image, is seen on reproduced images, which does not occur with an imager device without such an electronic shutter mechanism.

The results of experiments and studies on this defect made by the inventors of the present invention show that the defect in the image is caused by potential barriers and potential dips which may exist in the charge transfer regions 18 of the vertical register sections 6.

Next, how the defect in image occurs will be explained by way of example with reference to FIGS. 16A to 16F which are potential model drawings showing potential conditions of a portion of the charge transfer region 18 of the vertical register section 6. In the drawings, solid lines 30 indicate potential levels, projections 31 potential barriers, and recesses 32 potential dips, respectively. This example shows that the potential barrier 31 and the potential dip 32 exist in the charge transfer region 18 beneath the transfer electrode $19A_3'$. Particularly, it should be noted that the potential dip 32 exists at the vicinity of the charge transfer region 18 beneath the transfer electrode $19A_4'$.

FIG. 16A shows that charges (unnecessary charges) 33, which are read out to the vertical register section 6 by the unnecessary charge read-out pulse $P_1$, are transferred to the drain region 12 by the four-phase driving pulses $\phi v1'$, $\phi v2'$, $\phi v3'$ and $\phi v4'$ for the high-speed inverse-transfer operation. This condition is next changed to the condition shown in FIG. 16B. As will be seen from FIG. 16B, a portion of the unnecessary charges 33 is trapped by the potential dip 32 and another portion thereof is accumulated on one side of the potential barrier 31 or the side of the horizontal register section 8 because of the high speed transfer. When a predetermined time, for example, eight horizontal periods, has elapsed, the unnecessary charges 33 are discharged to the drain region 12, and the supply of the four-phase driving pulses $\phi v1'$, $\phi v2'$, $\phi v3'$ and $\phi v4'$ for the high-speed inverse-transfer operation is terminated. In this case, as shown in FIG. 16C, unnecessary charges 34 accumulated at one side of the potential barrier 31 and unnecessary charges 35, trapped in the potential dip 32, both remain.

Thereafter, the signal charge read-out pulse $P_2$ is supplied to the read-out gate area 7 to read out to the vertical register section 6 charges accumulated in the light receiving areas 5 after the unnecessary charge read-out pulse $P_1$ is supplied, which is shown in FIG. 16D. In this event, the unnecessary charges 34 accumulated at one side of the potential barrier 31 and the unnecessary charges 35, which are trapped in the potential dip 32, are mixed with signal charges 36. Next, the four-phase driving pulses $\phi v1$, $\phi v2$, $\phi v3$ and $\phi v4$ for the normal-speed normal-transfer operation are supplied to the vertical register section 6 to thereby transfer the signal charges 36 mixed with the unnecessary charges 34 and 35 together with adjacent signal charges 37 to the horizontal register section 8 by way of the processes shown in FIGS. 16E and 16F.

As described above, with the prior art solid state imager device provided with an electronic shutter, portions of unnecessary charges are mixed with the signal charges, and consequently the defects in image, that is, the luminous points, appear in the reproduced image.

Next, another example of such a defect in image will be explained with reference to FIGS. 17A to 17F which are potential model drawings showing potential conditions of a portion of the charge transfer region 18 of the vertical register section 6. In the drawings, solid lines 300 indicate potential levels, and recesses 320 potential dips, respectively. This example shows that the potential dip 320 exists in the charge transfer region 18 beneath the transfer electrode 19A$_3$', particularly, at the vicinity of the charge transfer region 18 beneath the transfer electrode 19A$_2$'.

FIG. 17A shows a condition at a certain time during the process that charges (unnecessary charges) 330 read out to the vertical register section 6 by the unnecessary charge read-out pulse P$_1$ are transferred to the drain region 12 by the four-phase driving pulses $\phi$v1', $\phi$v2', $\phi$v3' and $\phi$v4' for the high-speed inverse-transfer operation. This condition is next changed to that as shown in FIG. 17B. As will be seen from FIG. 17A, a portion 330A of the unnecessary charges 330 is trapped by the potential dip 320. However, in the condition of FIG. 17B, the potential dip 320 is crashed by the influence of the fringing field from the transfer electrode 19A$_2$', so that the unnecessary charges 320A remaining in the potential dip 320 are discharged to the charge transfer region beneath the transfer electrode 19A$_2$'. Therefore, the unnecessary charges 330 are all discharged to the drain region 12, and accordingly when the supply of the four-phase driving pulses $\phi$v1', $\phi$v2', $\phi$v3' and $\phi$v4' for the high-speed inverse-transfer operation has been terminated, the potential dip 320 is vacant, that is, charges are not trapped in the potential dip 320, as shown in FIG. 17C. Next, the signal charge read-out pulse P$_2$ is supplied to the read-out gate area 7 to read out, to the vertical register section 6, charges accumulated in the light receiving areas 5, after the unnecessary charge read-out pulse P$_1$ is supplied, as signal charges. FIG. 17D shows the condition in which the signal charges are read out to the vertical register section 6. As will be seen from FIG. 17D, a portion 360A of signal charges 360 is trapped by the potential dip 320. Then, the four-phase driving pulses $\phi$v1, $\phi$v2, $\phi$v3 and $\phi$v4 for the normal-speed normal-transfer operation are supplied to the vertical register section 6 to thereby transfer the signal charges 360 together with the subsequent signal charges 370 to the horizontal register section 8 by way of processes as shown in FIGS. 17E and 17F. Since the potential dip 320 and the transfer electrode 19A$_4$' are considerably separated from each other, the potential dip 320 is not crashed by the fringing field from the transfer electrode 19A$_4$', as shown in FIG. 17E. Thus, the charges 360A trapped in the potential dip 320 remain, as shown in FIG. 17F.

In the manner described above, since the portion 360A of the signal charges 360 is trapped in the potential dip 320, there is caused a defect in image, that is, black points appear in the reproduced image.

OBJECTS AND SUMMARY OF THE INVENTION

Accordingly, it is an object of the present invention to provide a solid state imager device which is capable to removing the above mentioned defects.

To achieve the above object, the present invention provides a solid state imager device, wherein charges accumulated in light receiving areas during an exposure before a vertical blanking period are read out to a vertical register section as unnecessary charges in the vertical blanking period, the unnecessary charges being discharged to a drain region by supplying the vertical register section with driving pulses to thereby drive the vertical register section at the high-speed inverse-transfer operation; charges accumulated in the light receiving areas, by an exposure after the unnecessary charges have been read out to the vertical register section, are read out to the vertical register section as signal charges, and then the signal charges are transferred to a charge detecting section through the vertical register section and a horizontal register section, characterized in that after the unnecessary charges have been discharged to the drain region, the vertical register section is set into a high-speed normal-transfer operation by supplying the same width driving pulses for a high-speed normal-transfer operation, before the signal charges are read out to the vertical register section.

These and other objects, features and advantages of the present invention will become apparent from the following detailed description of the preferred embodiments taken in conjunction with the accompanying drawings, throughout which like reference numerals desigante like elements and parts.

BRIEF DESCRIPTION OF THE DRAWINGS

FIGS. 2A-2F and 9A-9F are wave form charts used for explaining the embodiments of FIGS. 1 and 4, respectively;

FIGS. 3A-3H and 10A-10H are potential model charts used for explaining the embodiments of FIGS. 1 and 4, respectively;

FIG. 8 is a wave form chart of the four-phase driving pulses for the high-speed normal-transfer operation;

FIGS. 15A-15E are wave form charts used for explaining the previously proposed solid state imager device shown in FIG. 12; and FIGS. 16A-16F and 17A-17F are potential model charts used for exaplaining the previously proposed solid state imager device of FIG. 12.

DESCRIPTION OF THE PREFERRED EMBODIMENTS

A first embodiment of a solid state imager device according to the present invention will hereinafter be described with reference to FIGS. 1 to 3 of the accompanying drawings.

In these drawings, the parts corresponding to those in FIGS. 12 to 16 are designated the same reference numberals and the explanation thereof will be omitted.

Figure 1:
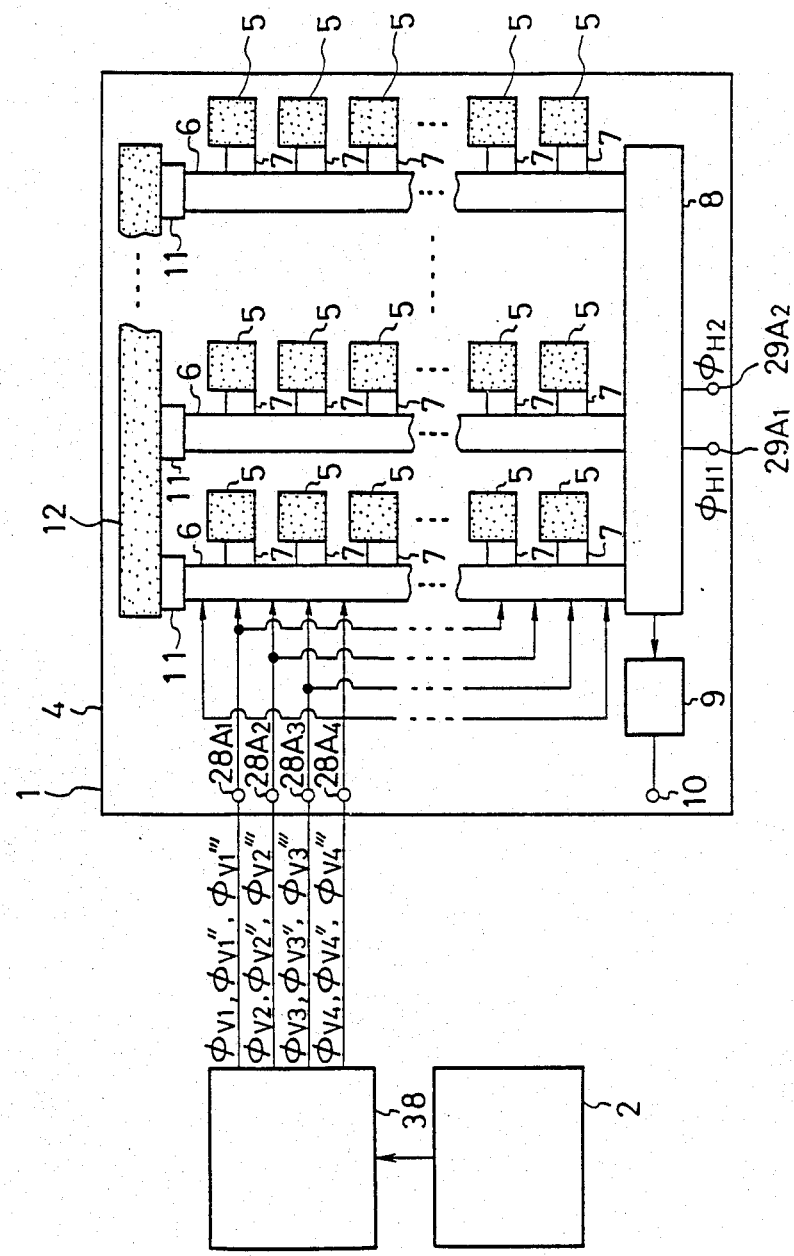
FIGS. 1 and 4 are block diagrams respectively showing the whole arrangement of an embodiment of a solid state imager device according to the present invention.
Figure 2:

The solid state imager device of the present embodiment comprises, as shown in FIG. 1, a solid state imager element section 1 which includes light receiving areas 5, read-out gate areas 7, vertical register sections 6, a horizontal register section 8, a charge detecting section 9, a drain region 12 and so on, formed on one major surface of a P-type silicon substrate 4, and a timing generator 38 which operates in response to a predetermined synchronizing signal supplied thereto from a synchronizing signal generating circuit 2.

Figure 12:
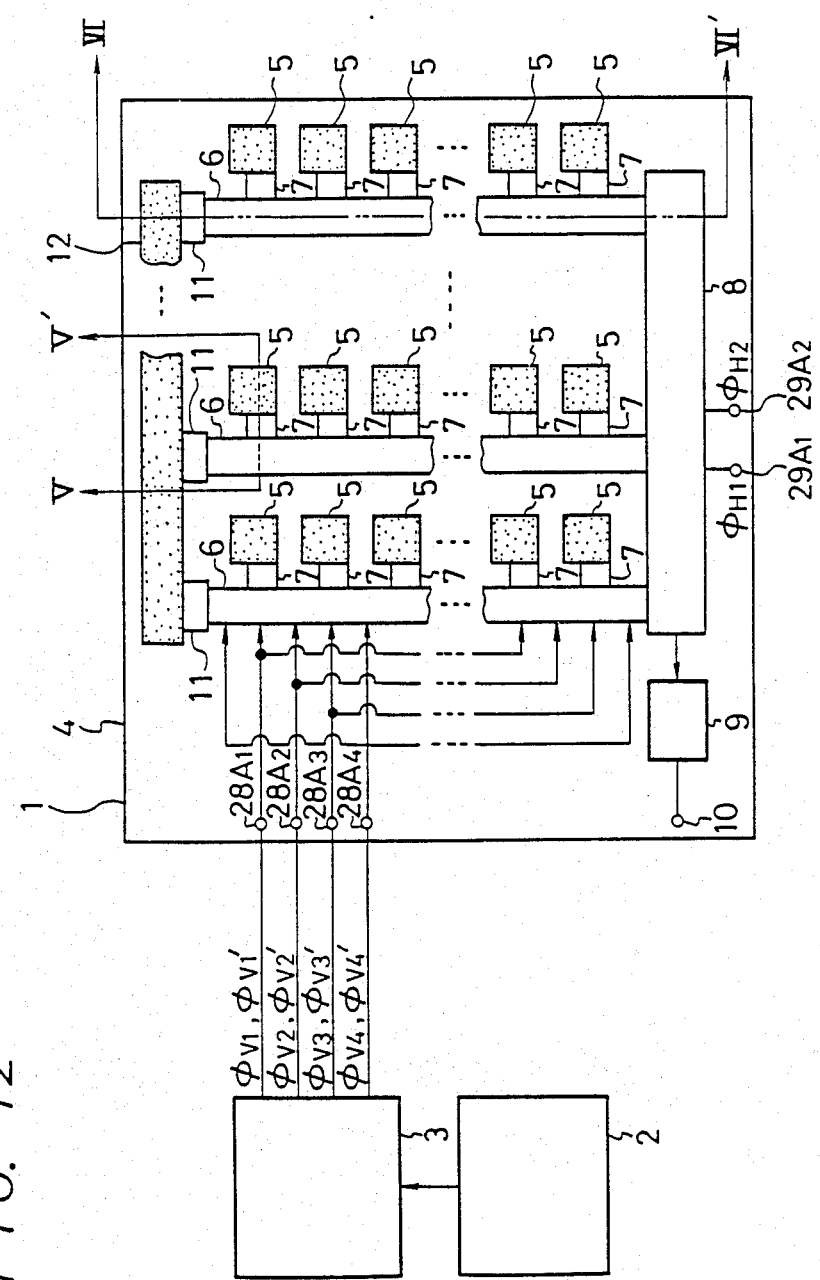
FIG. 12 is a block diagram schematically showing a previously proposed solid state imager device.

The solid state imager element section 1 is arranged in the same manner as the previously proposed example as shown in FIG. 12.

The timing generator 38 is so constructed as to generate the pulse $P_1$ for reading out unnecessary charges and the pulse $P_2$ for reading out signal charges, which are supplied to the read-out gate areas 7, the four-phase driving pulses $\phi v1$, $\phi v2$, $\phi v3$ and $\phi v4$ of 15.77 kHz (fsc/227, where fsc=3.58 MHz) for the normal-speed normal-transfer operation, the four-phase driving pulses $\phi v1''$, $\phi v2''$, $\phi v3''$ and $\phi v4''$ of 895 kHz (fsc/4) for the high-speed inverse-transfer operation, and the four-phase driving pulses $\phi v1'''$, $\phi v2'''$, $\phi v3'''$ and $\phi v4'''$ of 1790 kHz (fsc/2) for the high-speed normal-transfer operation, which are supplied to the vertical register sections 6, and the two-phase driving pulses $\phi_{H1}$ and $\phi_{H2}$ of 9.5 MHz which are supplied to the horizontal register section 8. The timing generator 38 is operated as described below.

Let it first be assumed that the normal mode is selected, namely the exposure time is set to one field period to obtain an image signal made up of charges accumulated in the light receiving areas 5 during one field period. As shown in FIG. 2B, the signal charge read-out pulse $P_2$ is supplied to the read-out gates 7 at a predetermined time point within the vertical blanking period at every field, whereby the charges accumulated in the light receiving areas 5 during one field period of exposure are read out to the vertical register sections 6 as signal charges. Then, as shown in FIG. 2C, subsequent to the supply of the signal charge read-out pulse $P_2$ to the read-out gate areas 7, the four-phase driving pulses $\phi v1$, $\phi v2$, $\phi v3$ and $\phi v4$ of 15.77 kHz for the normal-speed normal-transfer operation are supplied to the vertical register sections 6 to thereby transfer the read out signal charges to the horizontal register section 8. The horizontal register section 8 is always supplied with the two-phase driving pulses $\phi_{H1}$ and $\phi_{H2}$ of 9.5 MHz, so that the charges transferred from the vertical register section 6 thereto are transferred to the charge detecting section 9 at every horizontal line, and consequently the image signal, based on the signal charges, is delivered to an output terminal 10. FIG. 2A shows the waveform of a vertical synchronizing signal $V_{SYNC}$.

Next, it is assumed that the electronic shutter mode is selected as the exposure time mode, that is, the exposure time period is set to a desired time period within the vertical blanking period to provide a video signal based upon the charges accumulated in the light receiving areas 5 during this exposure time period. As shown in FIG. 2D, at the beginning of the vertical blanking period, the unnecessary charge read-out pulse $P_1$ is supplied to the read-out gate areas 7, whereby charges accumulated in the light receiving areas 5 before the vertical blanking period are read out to the vertical register sections 6 as unnecessary charges. Next, as shown in FIG. 2E, the four-phase driving pulses $\phi v1''$, $\phi v2''$, $\phi v3''$ and $\phi v4''$ of 895 kHz for the high-speed inverse-transfer operation are supplied to the vertical register sections 6 to thereby discharge the charges read out as unnecessary charges to the drain region 12 during 6.1 horizontal periods. Next, as shown in FIG. 2E, the four-phase driving pulses $\phi v1'''$, $\phi v2''40$, $\phi v3'''$ and $\phi v4'''$ of 1790 kHz for the high-speed normal-transfer operation are supplied to the vertical register sections 6 to drive the vertical register sections 6 at the high-speed normal-transfer operation during 2.7 horizontal periods. Next, as shown in FIG. 2D, the signal charge read-out pulse $P_2$ is supplied to the read-out gate areas 7, in the same manner as shown in FIG. 2B, to thereby read out the charges accumulated in the light receiving areas 5 after the supply of the unnecessary charge read-out pulse $P_1$ to the vertical register sections 6. Subsequently, as shown in FIG. 2E, the four-phase driving pulses $\phi v1$, $\phi v2$, $\phi v3$ and $\phi v4$ of 15.77 kHz for the normal-speed normal-transfer operation are supplied to the vertical register sections 6 whereby the charges read out as signal charges are transferred to the horizontal register section 8. Thus, in the electronic shutter mode, signal charges are accumulated in the light receiving areas 5, from the time the unnecessary charge read-out pulse $P_1$ is supplied to the read-out gate areas 7, to the time the signal charge read-out pulse $P_1$ is supplied to the same, for example, for 1/1800 of second, and the image signal based on those signal charges is derived to the output terminal 10.

Figure 13:
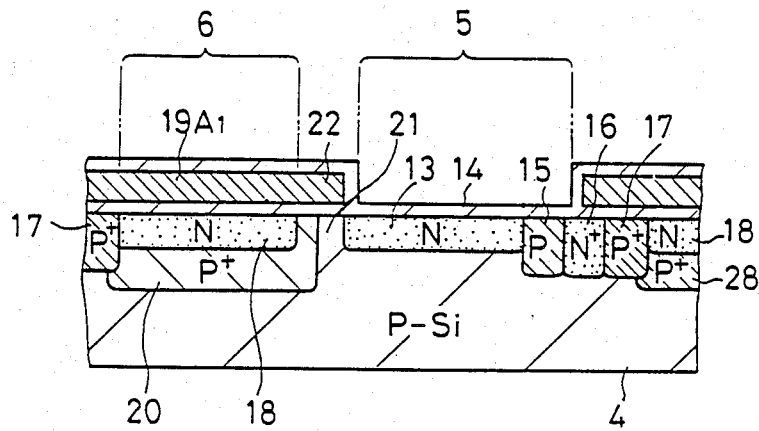
FIG. 13 is a cross-sectional view taken along a line V—V' in FIG. 12.
Figure 14:
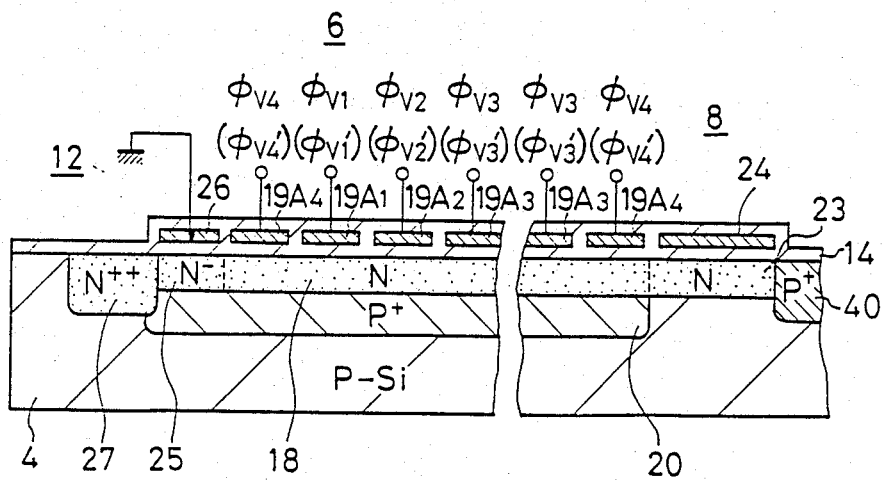
FIG. 14 is a cross-sectional view taken along a line VI—VI' in FIG. 12.

The rest of the present embodiment is arranged in the same manner as the previously proposed examples shown in FIGS. 12, 13 and 14.

Figure 3:
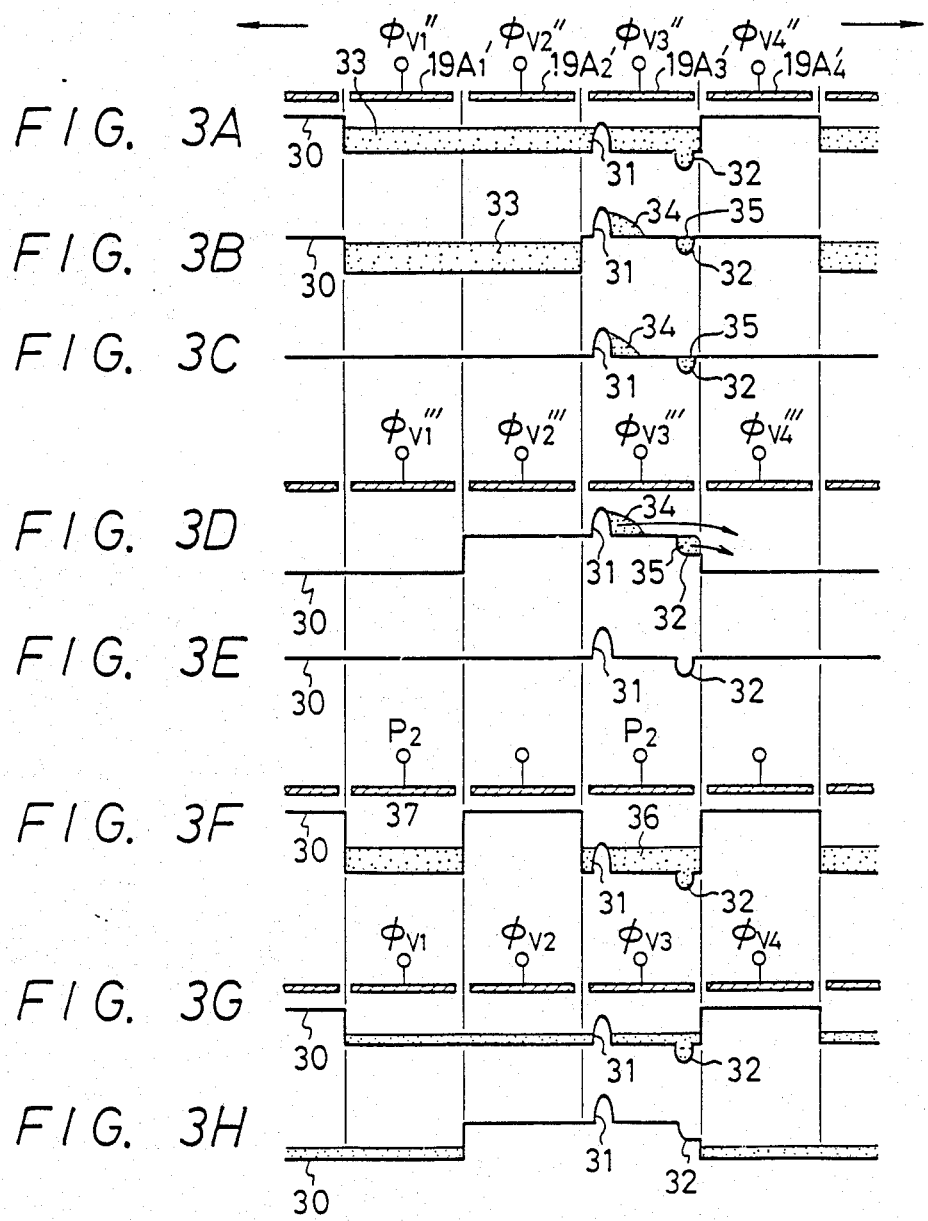

The solid state imager device of the present embodiment arranged as described above is advantageous in that even though the potential barrier 31 and the potential dip 32 exist in the same positions as FIG. 12, as shown in FIG. 3, the defect in image caused by them does not occur. The reason will hereinafter be explained with reference to FIGS. 3A to 3H.

FIG. 3A shows a condition at a certain time during the process that the charges (unnecessary charges) 33, read out to the vertical register section 6 by the unnecessary charge read-out pulse $P_1$, are transferred to the drain region 12 by the four-phase driving pulses $\phi v1''$, $\phi v2''$, $\phi v3''$ and $\phi v4''$ for the high-speed inverse-transfer operation. This condition is next changed as shown in FIG. 13B. Further, the unnecessary charges 33 are discharged to the drain region 12 by way of processes not shown. In this event, as shown in FIG. 3B, a portion of the unnecessary charges 33 is accumulated on one side of the potential barrier 31, that is, in the horizontal register section 8, and another portion of the same is trapped by the potential dip 32. Thus, these unnecessary charges remain after the supply of the four-phase driving pulses $\phi v1''$, $\phi v2''$, $\phi v3''$ and $\phi v4''$ for the high-speed inverse-transfer operation has been terminated.

However, in the above embodiment of the present invention, subsequent to the supply of the four-phase driving pulses $\phi v1''$, $\phi v2''$, $\phi v3''$ and $\phi v4''$ for the high-speed inverse-transfer operation, the vertical register sections 6 are supplied with the four-phase driving pulses $\phi v1'''$, $\phi v2'''$, $\phi v3'''$ and $\phi v4'''$ for the high-speed normal-transfer operation to transfer the charges toward the horizontal register section 8, whereby, as shown in FIG. 3D, the potential dip 32 located at the vicinity of the charge transfer region beneath the transfer electrode 19A$_4$' is crashed by the fringing field from the transfer electrode 19A$_4$', and consequently the unnecessary charges 35 trapped in the potential dip 32 are discharged to the charge transfer region beneath the transfer electrode 19A$_4$', and are then transferred toward the horizontal register section 8. Also, the unnecessary charges 34 accumulated at one side of the potential barrier 31 are transferred toward the horizontal register section 8. Therefore, when the supply of the four-phase driving pulses $\phi$v1''', $\phi$v2''', $\phi$v3''' and $\phi$v4''' for the high-speed normal-transfer operation is terminated, the unnecessary charges 35 trapped in the potential dip 32 and the unnecessary charges 34 accumulated at one side of the potential barrier 31 have completely been transferred to the horizontal register section 8, as shown in FIG. 3E. Then, the signal charge read-out pulse P$_2$ is supplied to the read-out gate areas 7 to read out charges accumulated in the light receiving areas 5 after the unnecessary charge read-out pulse P$_1$ is supplied to the read-out gate areas 7 to the vertical register section 6 as signal charges, as shown in FIG. 3F. In this event, since the unnecessary charges 34 and 35 have been removed, they are not at all mixed with the signal charges. Subsequently, the four-phase driving pulses $\phi$v1, $\phi$v2, $\phi$v3 and $\phi$v4 for the normal-speed normal-transfer operation are supplied to the vertical register section 6 to transfer the charges read out as the signal charges to the horizontal register section 8 by way of processes as partially shown in FIGS. 3G and 3H.

As described above, even if a potential barrier exists in the charge transfer region 18 of the vertical register section 6 or, for example, the potential barrier 31 exists beneath the transfer electrode 19A$_3$', and a portion of the charges (unnecessary charges 34) is accumulated at one side of the potential barrier 31 upon the high-speed inverse-transfer, the unnecessary charges 34 are transferred to the horizontal register section 8 before the signal charges are read out. It is therefore possible to prevent the defect in an image (the occurrence of the luminous points) which is caused by the signal charges mixed with the unnecessary charges 34.

Further, in the case where a portion of unnecessary charges (the unnecessary charges 35) is trapped by a potential dip which exists in the charge transfer region, if the potential dip 32 exists at the vicinity of the charge transfer region beneath the adjacent transfer electrode on the side of the horizontal register section 8, for example, if the potential dip is at the position as shown in FIG. 3, the unnecessary charges 35 trapped in the potential dip 32 are transferred to the horizontal register section 8 before the signal charges are read out. Thus, it is also possible to prevent the defect in an image (the occurrence of the luminous points) which is caused by the signal charges mixed with the unnecessary charges 35.

It will be understood that the solid state imager device of the present embodiment can suppress the defect in an image (the occurrence of the luminous points) caused by the potential barrier and potential dip formed in the charge tranfer region 18 of the vertical register section 6.

The above explanation applies to the case in which the frequency of the four-phase driving pulses $\phi$v1'', $\phi$v2'', $\phi$v3'' and $\phi$v4'' for the high-speed inverse-transfer operation is chosen to be 895 kHz and the frequency of the four-phase driving pulses $\phi$v1''', $\phi$v2''', $\phi$v3''' and $\phi$v4''' for the high-speed normal-transfer operation is chosen to be 1790 kHz. However, these frequencies are not limited to the above values and may be any other values, respectively.

Next, a second embodiment of the present invention will be described with reference to FIGS. 4 to 11. In these drawings, the parts corresponding to those in FIGS. 12 to 17 are designated by the same reference numerals and the explanation thereof will be omitted.

Figure 4:
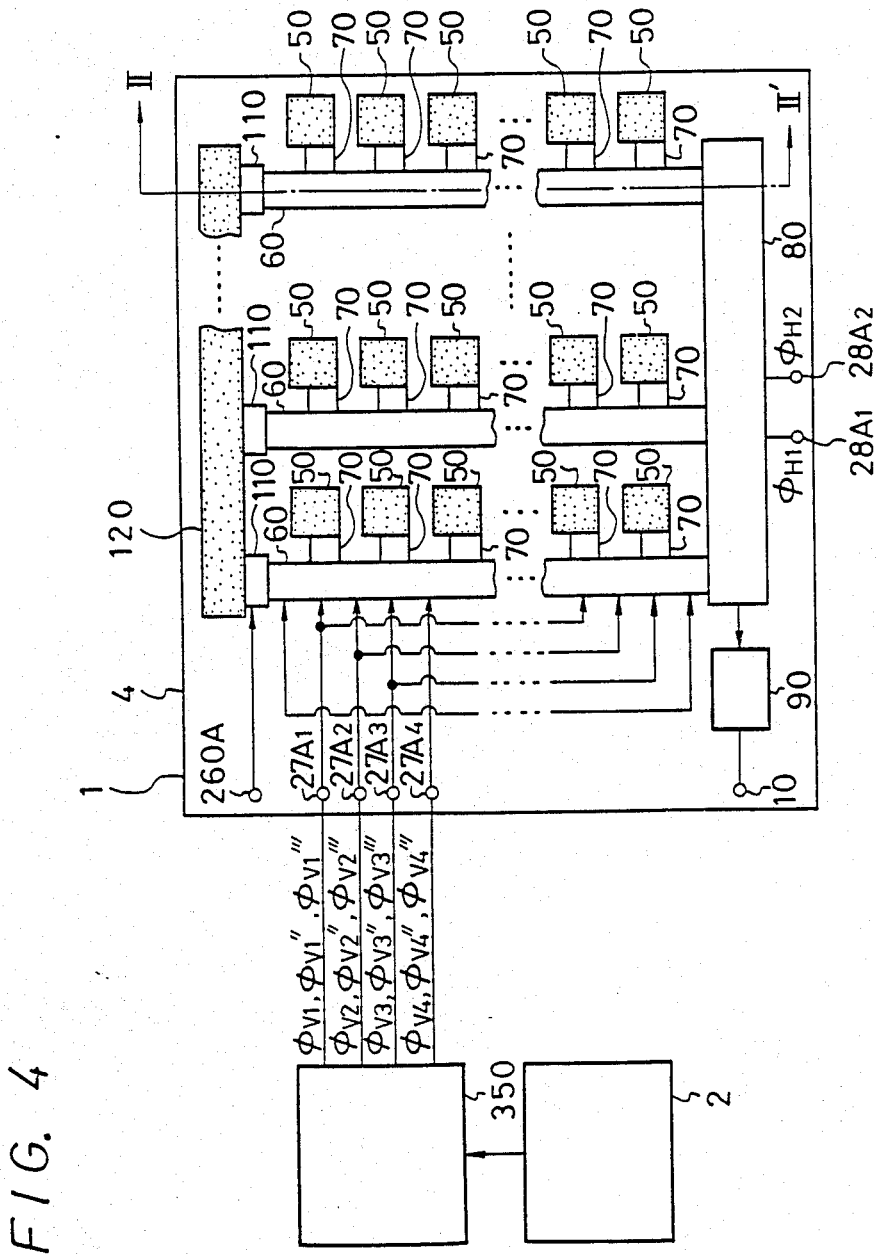

The solid state imager device of the second embodiment comprises, as shown in FIG. 4, a solid state imager element section 1 which includes light receiving areas 50, read-out gate areas 70, vertical register sections 60, a horizontal register section 80, a charge detecting section 90, a drain region 120 and so on, formed on one major surface of a P-type silicon substrate 4, and a timing generator 350 which operates in response to a predetermined sychronizing signal supplied thereto from a synchronizing signal generating circuit 2.

Figure 5:
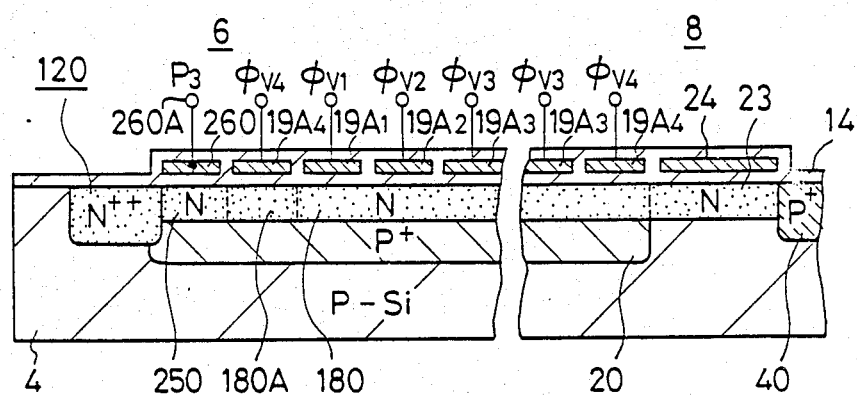
FIG. 5 is a cross-sectional view taken along a line II—II' in FIG. 4.

The solid state imager element section 1 is arranged in the same manner as the previously proposed example shown in FIG. 12, except that it is provided with a terminal 260A, as shown in FIGS. 4 and 5, through which a discharge gate electrode 260 of a discharge gate area 110 can be supplied with a charge implanting pulse P$_3$ which is generated by the timing generator 350, as will be later referred to.

Figure 6:
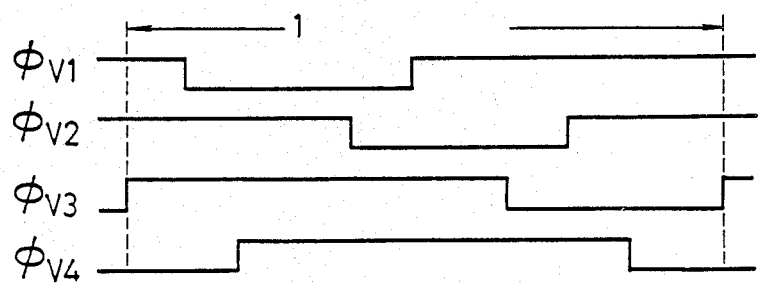
FIG. 6 is a wave form chart of the four-phase driving pulses for the normal-speed normal-transfer operation.
Figure 7:
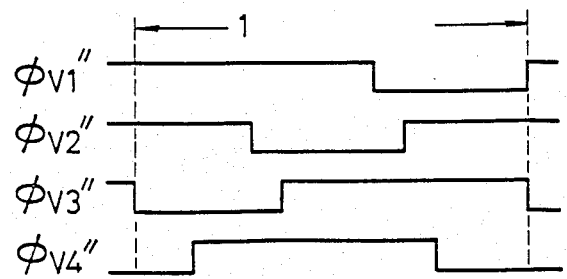
FIG. 7 is a wave form chart of the four-phase driving pulses for the high-speed inverse-transfer operation.

The timing generator 350 is so constructed as to generate the pulse P$_1$ for reading out unnecessary charges and the pulse P$_2$ for reading out signal charges which are supplied to the read-out gate areas 70, the four-phase driving pulses $\phi$v1, $\phi$v2, $\phi$v3 and $\phi$v4 of 15.77 kHz (fsc/227, where fsc=3.58 MHz) for the normal-speed normal-transfer operation, the four-phase driving pulses $\phi$v1'', $\phi$v2'', $\phi$v3'' and $\phi$v4'' of 895 kHz (fsc/4) for the high-speed inverse-transfer operation, and the four-phase driving pulses $\phi$v1''', $\phi$v2''', $\phi$v3''' and $\phi$v4''' of 1790 kHz (fsc/2) for the high-speed normal-transfer operation, which are all supplied to the vertical register sections 60, and the two-phase driving pulses $\phi_{H1}$ and $\phi_{H2}$ of 9.5 MHz which are supplied to the horizontal register section 80. The four-phase driving pulses $\phi$v1, $\phi$v2, $\phi$v3 and $\phi$v4 for the normal-speed normal-transfer operation, the four-phase driving pulses $\phi$v1'', $\phi$v2'', $\phi$v3'' $\phi$v4'' for the high-speed inverse-transfer operation, and the four-phase driving pulses $\phi$v1''', $\phi$v2''', $\phi$v3''' and $\phi$v4''' for the high-speed normal-transfer operation have the waveforms as shown in FIGS. 6, 7 and 8, respectively. The timing generator 350 further generates the charge implanting pulse P$_3$ which has a predetermined positive voltage value. The charge implanting pulse P$_3$ is supplied to the discharge gate electrode 260, as shown in FIG. 5, to make the potential level of the discharge gate region 250 deeper than that of the drain region 120, whereby charges in the drain region 120 are implanted into a charge transfer region 180A beneath the transfer electrode 19A$_4$ adjacent to the discharge gate region 250 through the discharge gate region 250. The present embodiment thus arranged is operated as described below.

Let it first be assumed that the normal mode is selected, namely the exposure time period is set to one field period to provide an image signal based on the charges accumulated in the light receiving areas 50 during one field period. As shown in FIG. 9B, the signal charge read-out pulse P$_2$ is supplied at every field to the read-out gates 70 at a predetermined time point within the vertical blanking period, whereby charges accumulated in the light receiving areas 50 during one field period of exposure are read out to the vertical register sections 60 as signal charge. Then, as shown in FIG. 9C, the four-phase driving pulses $\phi v1$, $\phi v2$, $\phi v3$ and $\phi v4$ of 15.77 kHz for the normal-speed normal-transfer operation are supplied to the vertical register sections 60 to thereby transfer the read out signal charges to the horizontal register section 80. The horizontal register section 80 is always supplied with the two-phase driving pulses $\phi_{H1}$ and $\phi_{H2}$ of 9.5 MHz, so that charges transferred from the vertical register sections 60 thereto are transferred to the charge detecting section 90 at every horizontal line, and consequently the image signal based on the signal charges is supplied to the output terminal 10. FIG. 9A shows the waveform of the vertical synchronizing signal $V_{SYNC}$.

Next, it is assumed that the electronic shutter mode is selected as the exposure time mode, that is, the exposure time period is set to a desired time period within the vertical blanking period to obtain an image signal based upon the charges accumulated in the light receiving areas 50 during the desired time period. As shown in FIG. 9D, at the beginning of the vertical blanking period, the unnecessary charge read-out pulse $P_1$ is supplied to the read-out gate areas 70, whereby charges accumulated in the light receiving areas 50 before the vertical blanking period are read out to the vertical register sections 60 as unnecessary charges. Next, as shown in FIG. 9E, the four-phase driving pulses $\phi v1''$, $\phi v2''$, $\phi v3''$ and $\phi v4''$ of 895 kHz for the high-speed inverse-transfer operation are supplied to the vertical register sections 6 to thereby discharge the charges read out as unnecessary charges to the drain region 120 during 6.1 horizontal periods. Next, as shown in FIG. 9F, the charge implanting pulse $P_3$ is supplied to the discharge gate electrode 260 to make the potential level of the discharge gate region 250 deeper than that of the drain region 120 so that a predetermined quantity of the charges is implanted into the charge transfer region 180A beneath the transfer electrode $19A_4$ adjacent to the discharge gate region 250. Next, as shown in FIG. 9E, the four-phase driving pulses $\phi v1'''$, $\phi v2'''$ and $\phi v4'''$ of 1790 kHz for the high-speed normal-transfer operation are supplied to the vertical register sections 60 to set the vertical register sections 60 into the high-speed normal-transfer operation state during 2.7 horizontal periods to thereby transfer the charges implanted thereto from the drain region 120 to the horizontal register section 80. It should be noted that the signal based on the implanted charges and supplied to the output terminal 10 should not be used as an image signal. Next, as shown in 9D, the signal charge read-out pulse $P_2$ is supplied to the read-out gate areas 70, in the same manner as shown in FIG. 9B, to thereby read out charges accumulated in the light receiving areas 50 after the unnecessary charge read-out pulse $P_1$ is supplied to the read-out gate areas 70 to the vertical register sections 60. Then, as shown in FIG. 9E, the four-phase driving pulses $\phi v1$, $\phi v2$, $\phi v3$ and $\phi v4$ of 15.77 kHz for the normal-speed normal-transfer operation are supplied to the vertical register sections 60, whereby the charges read out as signal charges are transferred to the horizontal register section 80. Thus, in the electronic shutter mode, signal charges are accumulated in the light receiving areas 50 from the time the unnecessary charge read-out pulse $P_1$ is supplied to the read-out gate areas 70 to the time the signal charge read-out pulse $P_2$ is supplied to the same, for example, for 1/1800 of second, and an image signal based on those signal charges is supplied to the output terminal 10.

The rest of the second embodiment is arranged in the same manner as the previously proposed example shown in FIG. 12.

The solid state imager device of the present embodiment arranged as described above is advantageous in that even though, as shown in FIG. 10, a potential dip 320 exists in the same position as shown in FIG. 12, the defect in an image caused by the potential dip 320 does not occur. The reason will hereinafter be explained with reference to FIGS. 10A to 10H.

FIG. 10A shows a condition at a certain time during the process that charges (unnecessary charges) 330 read out to the vertical register section 60 by the unnecessary charge read-out pulse $P_1$ are transferred to the drain region 120 by the four-phase driving pulses $\phi v1''$, $\phi v2''$, $\phi v3''$ and $\phi v4''$ for the high-speed inverse-transfer operation. This condition is next changed as shown in FIG. 10B. Subsequently, the unnecessary charges 330 are discharged to the drain region 120 by way of processes not shown. In this event, a portion 330A of the unnecessary charges 330 is trapped by the potential dip 320. However, in the condition of FIG. 10B, the potential dip 320 is crashed by the influence of the fringing field from the transfer electrode $19A_2'$, whereby the unnecessary charges 330A trapped in the potential dip 320 are discharged to the charge transfer region beneath the transfer electrode $19A_2'$. Therefore, when the unnecessary charges 330 have been transferred to the drain region 120 and the supply of the four-phase driving pulses $\phi v1''$, $\phi v2''$, $\phi v3''$ and $\phi v4''$ for the high-speed inverse-transfer operation has been terminated, the potential dip 320 is vacant, that is, no charge remains in the potential dip 320. However, in the present embodiment, the charge implanting pulse $P_3$ is supplied to the discharge gate electrode 260 to implant a predetermined quantity of charges 380 into the charge transfer region 180A beneath the transfer electrode $19A_4'$ adjacent to the discharge gate region 250, and subsequently the four-phase driving pulses $\phi v1'''$, $\phi v2'''$, $\phi v3'''$ and $\phi v4'''$ for the high-speed normal-transfer operation are respectively supplied to the transfer electrodes $19A_1$, $19jA_2$, $19A_3$ and $19A_4$ to transfer the implanted charges 380 toward the horizontal register section 80. A portion 380A of the implanted charges 380, which has been implanted by way of the processes as shown in FIGS. 10D and 10E, is trapped by the potential dip 320. In other words, the potential dip 320 is filled with the portion 380A of the implanted charges 380. Next, as shown in FIG. 10F, the signal charge read-out pulse $P_2$ is supplied to the read-out gate areas 70 to read out charges accumulated in the light receiving areas 50 after the unnecessary charge read-out pulse $P_1$ is supplied to the read-out gate areas 70 to the vertical register sections 60 as signal charges, and then the four-phase driving pulses $\phi v1$, $\phi v2$, $\phi v3$ and $\phi v4$ for the normal-speed normal-transfer operation are supplied to the vertical register sections 60 to transfer the charges read out as the signal charges to the horizontal register section 80 by way of processes as partially shown in FIGS. 10G and 10H. Since the potential dip 320 is filled with the charges 380A, the signal charges are not trapped by the potential dip 320.

As set forth above, even if the potential dip 320 exists in the charge transfer region 180 of the vertical register sections 60, the signal charges will not be trapped by the potential dip 320, so that the defect in an image, that is, the black point, caused by the potential dip 320 does not appear in the reproduced image.

Figure 11:
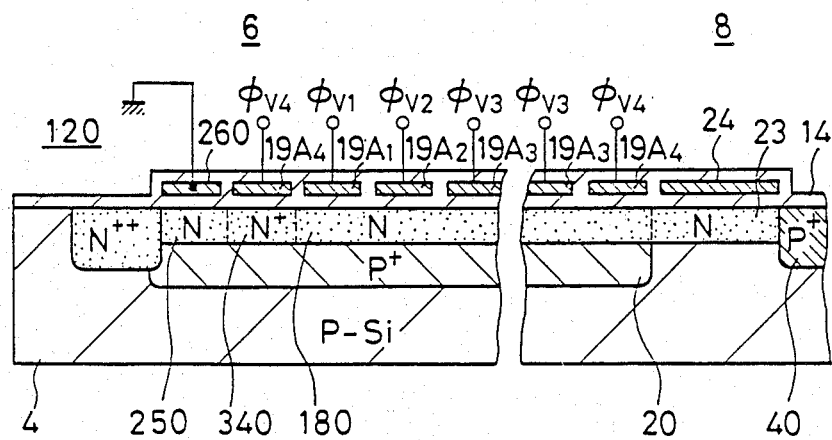
FIG. 11 is a cross-sectional view showing a main portion of a second embodiment of the present invention.

The above description applies to the case in which the predetermined quantity of charges are implanted into the charge transfer region 180A beneath the transfer electrode 19A$_4$ adjacent to the discharge gate region 250, by supplying the charge implanting pulse P$_3$ to the discharge gate electrode 260 and the transfer to the horizontal register section 80. Apart from that, many modifications can be made such as where the charge transfer region beneath the transfer electrode 19A$_4$ adjacent to the discharge gate region 250 is formed of an N+-type region 340, which is provided by diffusing an N-type impurity with relatively high concentration, as shown in FIG. 11, in a manner that the potential level of the charge transfer region 340 is made deeper than that of the discharge gate region 250, even when the transfer electrode 19A$_4$ is supplied with a low level voltage. With this arrangement, when unnecessary charges are discharged to the drain region 120, the charge transfer region 340 is used as a charge accumulating region so that a portion of the unnecessary charges remains in the charge transfer region 340. The charges accumulated in the charge transfer region 340 are transferred to the horizontal register section 80 by the four-phase driving pulses $\phi v1'''$, $\phi v2'''$, $\phi v3'''$ and $\phi v4'''$ for the high-speed normal-transfer operation. The same effects as described above can also be produced in this case, too.

Further, the above explanation relates to where the frequency of the four-phase driving pulses $\phi v1''$, $\phi v2''$, $\phi v3''$ and $\phi v4''$ for the high-speed inverse-transfer operation is chosen to be 895 kHz and the frequency of the four-phase driving pulses $\phi v1'''$, $\phi v2'''$, $\phi v3'''$ and $\phi 4'''$ for the high-speed normal-transfer operation is chosen to be 1790 kHz, respectively. However, these frequencies are not limited to the above values and may be any other values, respectively.

According to the present invention as described above, even if a potential barrier exists in the charge transfer region of the vertical register section and a portion of unnecessary charges is accumulated at one side of the potential barrier, the unnecessary charges are not mixed with signal charges, so that the defect in the image (the occurrence of the luminous points) caused by the signal charges mixed with the unnecessary charges can be prevented.

Moreover, even if a potential dip exists and a portion of the unnecessary charges is trapped by the potential dip in the high-speed inverse-transfer operation, provided that the potential dip is positioned at the vicinity of the charge transfer region beneath the adjacent transfer electrode on the side of the horizontal register section, the unnecessary charges are not mixed with the signal charges, so that the defect in the image (the occurrence of the luminous points) caused by the signal charges mixed with the unnecessary charges can be prevented.

It will be clearly understood that the first embodiment of the present invention can suppress the defect in the image (luminous points) caused by the potential barrier and the potential dip which exist in the charge transfer region of the vertical register section.

It will be also understood that the second embodiment of the present invention can prevent the signal charges from being trapped by the potential dip to thereby remove the defect in the image, that is, the black points caused by the potential dip.

The above description is given on the preferred embodiments of the invention but it will be apparent that many modifications and variations could be effected by one skilled in the art without departing from the spirit or scope of the novel concepts of the invention so that the scope of the invention should be determined by the appended claims only.

I claim as my invention;

1. A solid state imager device, having light receiving areas during an exposure, for accumulating charges before a vertical blanking period, said charges being read out to a vertical register section as unnecessary charges in the vertical blanking period, means for discharging said unnecessary charges to a drain region by supplying said vertical register section with driving pulses for a high-speed inverse-transfer operation to thereby drive said vertical register section at the high-speed inverse-transfer operation, means for reading out to said vertical register section, as signal charges, the charges accumulated in said light receiving areas by an exposure after said unnecessary charges have been read out to said vertical register section, and means for transferring said signal charges to a charge detecting section through said vertical register section and a horizontal register section, characterized by means, operative after said unnecessary charges have been discharged to said drain region, to set said vertical register section into a high-speed normal-transfer operation by supplying the same with driving pulses for a high-speed normal-transfer operation, before said signal charges are read out to said vertical register section.

2. A solid state imager device having light receiving areas, means for reading out charges accumulated during an exposure before the vertical blanking period in said light receiving areas to a vertical register section as unnecessary charges in the vertical blanking period, said unnecessary charges being discharged to a drain region by supplying said vertical register section with driving pulses for a high-speed inverse-transfer operation to thereby set said vertical register section at the high-speed inverse-transfer operation, means for reading out to said vertical register section, as signal charges, the charges accumulated in said light receiving areas by an exposure after said unnecessary charges have been read out to said vertical register section, and then said signal charges being transferred to a charge detecting section through said vertical register section and a horizontal register section, characterized by means establishing a charge accumulating region in said vertical register section at the side of said drain region whereby a portion of said unnecessary charges discharged to said drain region is accumulated therein, or charges are implanted into said vertical register section from said drain region; and means operative after said unnecessary charges have been discharged to said drain region, to set said vertical register section into a high-speed normal-transfer operation to transfer said charges accumulated in said charge accumulating region or said charges implanted from said drain region to said horizontal register section; and means for reading out said signal charges are from said light receiving areas to said vertical register section.

3. For use with a solid state imager device having light receiving areas for accumulating charges, during an exposure, means for discharging certain of said charges to a drain region as unnecessary charges, and means for reading out others of said charges to a vertical register section as signal charges, the method comprising the steps of;

after said unnecessary charges have been discharged to said drain region, setting said vertical register section into a high-speed normal-transfer operation by supplying said vertical register section with driving pulses for a high speed normal-transfer operation; and subsequently reading out said signal charges to said vertical register section.

* * * * *